United States Patent [19]

Kimata et al.

[11] Patent Number: 5,060,038
[45] Date of Patent: Oct. 22, 1991

[54] CHARGE SWEEP SOLID-STATE IMAGE SENSOR

[75] Inventors: Masafumi Kimata; Naoki Yutani; Masahiko Denda, all of Itami, Japan

[73] Assignee: Mitsubishi Denki Kabushiki Kaisha, Tokyo, Japan

[21] Appl. No.: 442,461

[22] Filed: Nov. 30, 1989

Related U.S. Application Data

[63] Continuation of Ser. No. 244,651, Sep. 13, 1988, abandoned, which is a continuation of Ser. No. 893,933, Aug. 6, 1986, abandoned.

[30] Foreign Application Priority Data

Aug. 13, 1985 [JP] Japan ............................ 60-179653

[51] Int. Cl.⁵ ............... H01L 29/78; H01L 27/14; H01L 31/00
[52] U.S. Cl. ....................................... 357/24; 357/30
[58] Field of Search ......................... 357/24, 30

[56] References Cited

U.S. PATENT DOCUMENTS

| | | | |
|---|---|---|---|
| 3,995,302 | 11/1976 | Amelio | 357/24 LR |
| 4,012,587 | 3/1977 | Ochi et al. | 357/24 LR |
| 4,117,514 | 9/1978 | Terui et al. | 357/24 LR |
| 4,385,307 | 5/1983 | Suzuki | 357/24 LR |
| 4,548,671 | 10/1985 | Kosonocky et al. | 357/24 LR |
| 4,577,233 | 3/1986 | Kimata . | |
| 4,581,539 | 4/1986 | Kimata . | |

Primary Examiner—Gene M. Munson
Attorney, Agent, or Firm—Lowe, Price, LeBlanc and Becker

[57] ABSTRACT

An image sensor using a charge sweep device as a vertical transfer device (3) and comprising a plurality of pixels (10) each of which is formed of a single photo-electro transforming element (1) and a single transfer gate (4) for transferring a signal charge from the photo-electro transforming element into the charge sweep device (3), wherein the width of the transfer gate (4) is equal to or larger than that of the photo-electro transforming element in the direction of charge transfer in the charge sweep device (3).

27 Claims, 3 Drawing Sheets

CHARGE SWEEP SOLID-STATE IMAGE SENSOR

This application is a division of application Ser. No. 07/244,651, filed Sept. 13, 1988, now abandoned, which is a continuation of Ser. No. 06,893,933, filed Aug. 6, 1986, now abandoned.

BACKGROUND OF THE INVENTION

1. Field of the Invention

The present invention relates to an improvement of a structure of a transfer gate for increasing the transfer efficiency of a signal charge in a solid-state image sensor using a charge transfer device for reading signals.

2. Description of the Prior Art

FIG. 1 is a diagram showing a layout of one pixel of an image sensor employing a Charge Sweep Device (CSD), disclosed in, e.g., Kimata et al., "A 480×400 Element Image Sensor with a Charge Sweep Device", *ISSCC Digest of Technical Papers*, Feb. 1985, pp. 100–101 and in *Japan Television Society Technical Report* No. TEVS 101-6, ED 841, 1985, by Kimata et al., which teaches that the basic idea of the CSD is that the signal charge from one photodiode is transferred, spread over the vertical charge transfer device and collected by the sweep operation. The publication by Yamawaki et al., "A ½ FORMAT COLOR IMAGE SENSOR with 485×510 PIXELS", SPSE & IGC Electronic Imaging '85, ADVANCE PRINTING OF PAPER SUMMARIES, Oct. 1985, pp. 91–94, also describes the operation of a CSD.

Both publications describe the operation of FIGS. 6 and 7. FIG. 6 shows a block diagram for a CSD, and FIG. 7 shows a series of operation steps for a CSD. In FIG. 6 the gates of a single row are connected to each other by a vertical scanning line. The transfer gate scanner supplies a single vertical scanning line with a select signal during a horizontal blanking period to read out the signal charge from one photodiode at a time to the CSD channel. The signal charge as read out can be split into a few neighboring potential wells as shown in FIG. 7a, because each potential well, being as small as lithography permits, does not have enough capacity for the full signal charge from the single diode. During the horizontal scanning interval, the large signal charge from several neighboring wells is swept out by the CSD scanner driven by a 4-phase clock pulse, as shown in FIG. 7(b–d), and the signal charge is collected in the storage gate. In the next horizontal blanking period the signal charge is transferred to the horizontal blanking period the signal charge is transferred to the horizontal CCD through the storage control gate as shown in FIG. 7f. Transfer efficiency can be improved by an additional sweep-out operation because any residual charge $Q_R$ caused by incomplete transfer, is added to the main signal charge as shown in FIGS. 7(d–e). The advantage of the aforementioned arrangement is that the channel width of the CSD can be narrowed to a size limited only by lithography techniques without subsequent charge handling capacity degradation.

A solid-image sensor FIG. 1 comprises a photodiode 1 for converting a given optical signal into a signal charge, a transfer gate 4 having a surface channel for selectively reading the signal from the photodiode 1, and a transfer channel 3 composed of a buried channel forming a path for transferring the signal charge from the transfer gate 4. The charge transfer operation of the transfer gate 4 and the transfer channel 3 is controlled according to a voltage level applied from a scanning line 5 to a gate electrode 2 through a contact hole 6. Namely, one pixel in the solid-state image sensor is composed of one photodiode and one gate. The gate electrode 2 applies the same voltage to the transfer channel 3 and the transfer gate 4.

FIG. 2 is a diagram schematically illustrating potential formed on the cross section taken from the line A-A' in FIG. 1, wherein FIG. 2 (a) shows a potential state at the time when a signal charge is stored; and FIG. 2 (bl) shows a potential state at the time of signal reading. In FIG. 2 (a), region I corresponds to the portion of the photodiode 1, region II corresponds to the portion of the transfer gate, and region III corresponds to the transfer device (CSD) portion. The operation will be hereinafter described with reference to FIGS. 1, 2 (a) and 2 (b).

First, the signal charge storing operation will be described. In this operation, the potential applied to the gate electrode 2 changes repeatedly between the "H" level and the "L" level. Since the transfer gate electrode shares the gate electrode 2 with the CSD gate electrode, the potential of the transfer gate 4 changes between $\phi_T$ (H) and $\phi_T$ (L), and the potential of the CSD gate 3 changes between $\phi_C$ (H) and $\phi_C$ (L), respectively, in response to the potential applied to the gate electrode 2. If the transfer gate 4 operates in the accumulation mode in this period, $\phi_T(H)$ may be equal to $\phi_T(L)$. Now, since the transfer gate 4 is composed of a surface channel and the CSD 3 is composed of a buried channel, the potential well formed in the CSD 3 becomes deeper than that of the transfer gate 4. A potential well formed below the photodiode 1 is deeper than the potential well below the transfer gate 4. Therefore, in this condition, the signal charge $Q_{sig}$ detected by the photodiode 1 is not transferred but stored in the potential well below the photodiode 1.

Next, the signal-reading operation will be described. In this operation, the potential applied to the gate electrode 2 becomes the "HH" level, which is higher than the "H" level. Accordingly, the potential wells formed below the transfer gate 4 and the CSD 3 become deeper than those in the storing operation shown in FIG. 2 (a), and the signal charge $Q_{sig}$ stored in the photodiode 1 is read out to the CSD 3. The read signal charge is transferred along the transfer channel of the CSD 3 to be read out.

FIG. 3 is a cross sectional structure diagram taken from the line B-B' in FIG. 1. In FIG. 3, an impurity region 8 of a second conductivity type for forming a buried channel serving as the charge transfer channel is provided on a semiconductor substrate 7 of a first conductivity type. An impurity diffusion layer 9 for cell isolation having high impurity density of the first conductivity type formed, for example, by ion implantation and a cell isolation oxide film 10 formed by, for example the selective oxidation process are provided in order to electrically isolate cells adjacent to one another. As shown in FIG. 3, the impurities from the impurity region 9 for cell isolation having high impurity density diffuse into a channel region 8. In the case of the selective oxidation process, the oxide film 10 for cell isolation is formed after the formation of the impurity region 9. During thermal processing in the formation of the oxide film 10, the impurity diffuses from the impurity region 9 into the transfer channel 8; this may be the reason of the foregoing. In this case, if the channel width of the CSD becomes narrower, the substantial impurity density of the channel 8 decreases under the influence of the impurity region 9, resulting in a phenomenon that the potential well in the transfer channel becomes narrower (so called narrow channel effect).

FIG. 4 schematically illustrates the potential state on the cross section taken along the line C-C' in FIG. 1. In FIG. 4, the region IV represents a transfer channel region connected to the transfer gate. In the region IV, a transfer gate is formed on the one side of the transfer channel (CSD) and the impurity region 9 having high impurity density shown in FIG. 3 is formed on the other side thereof. Therefore, the narrow channel effect in the transfer channel with impurity regions of high impurity density formed on the both sides thereof is stronger than the narrow channel effect in the transfer channel region connected to the transfer gate. Consequently, a potential well is formed in the transfer channel region IV connected to the transfer gate 4, in which the charge $Q_B$ is stored. Therefore, in signal charge transfer operation in the above described structure, the signal charge is transferred with the charge $Q_B$ remaining in the potential well, resulting in incomplete transfer of the charge which decreases the transfer efficiency.

In addition, there is a possibility of noise being produced by the fluctuation of the residual charge $Q_B$.

With respect to the basic structure and operation of a conventional solid-state image sensor, see, Yamawaki et al., "A ½ FORMAT COLOR IMAGE SENSOR with 485×510 PIXELS", *SPSE & IGC Electronic Imaging '85, ADVANCE PRINTING OF PAPER SUMMARIES*, Oct. 1985, pp. 91-94, which discloses a color image sensor using a Charge Sweep Device as a vertical charge transfer device, as well as Kimata et al., "A 480×400 Element Image Sensor with a Charge Sweep Device", ISSCC Digest of Technical Papers, Feb., 1985, pp, 100-101, which is referred to with respect to FIG. 1.

SUMMARY OF THE INVENTION

An object of the present invention is to provide a solid-state image sensor which eliminates the above described problems, prevents the formation of the potential well in the transfer channel and enables the complete transfer of the signal charge.

In the image sensor according to the present invention, the width of the transfer gate along the direction of the signal charge transfer is made wider than the width of a photo-electro transforming element such as a photodiode along that direction.

By the width of the transfer gate, the narrow channel effects are restrained uniformly along the direction of the charge transfer in the charge transfer channel thereby preventing a potential well from being formed the transfer channel.

These and other object and features of the present invention will be apparent from the detailed description with reference to the appended drawings.

DESCRIPTION OF THE PREFERRED EMBODIMENTS

Figure 1:
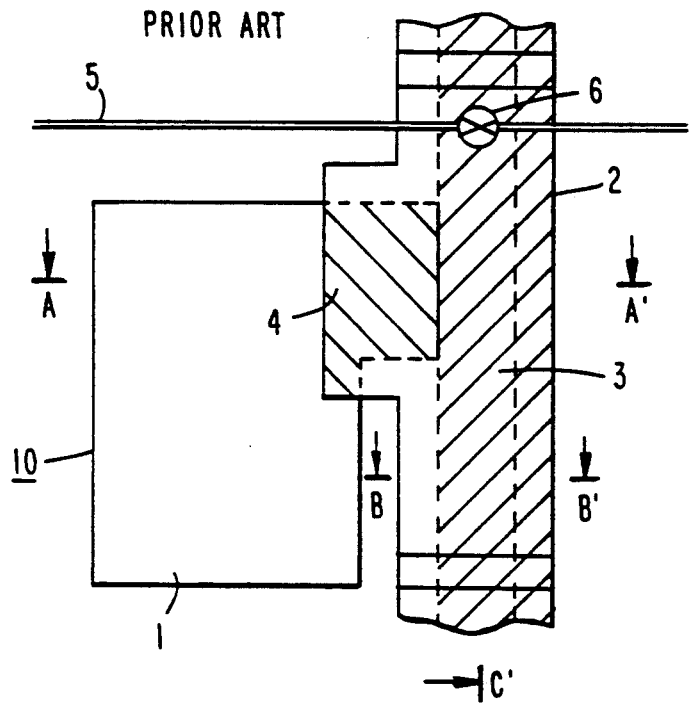
FIG. 1 is a plan view showing a structure of one pixel of an image sensor according to a conventional CSD system.
Figure 2A:
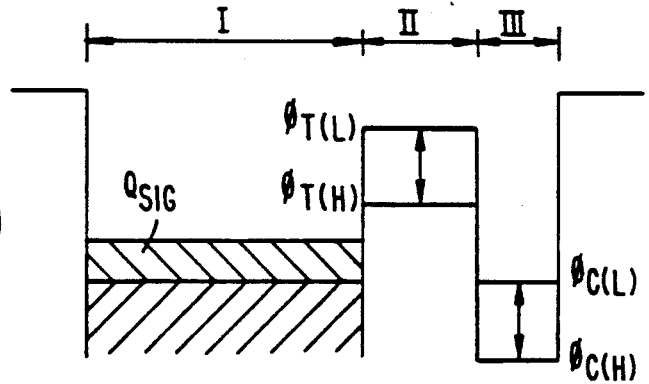
FIG. 2 is a cross sectional view taken along the line A-A' in FIG. 1 showing the potential state formed at the time of charge storage operation and charge read out operation.
Figure 2B:
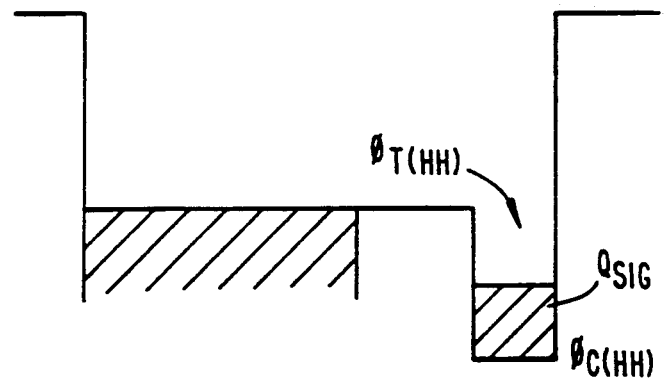
Figure 5:
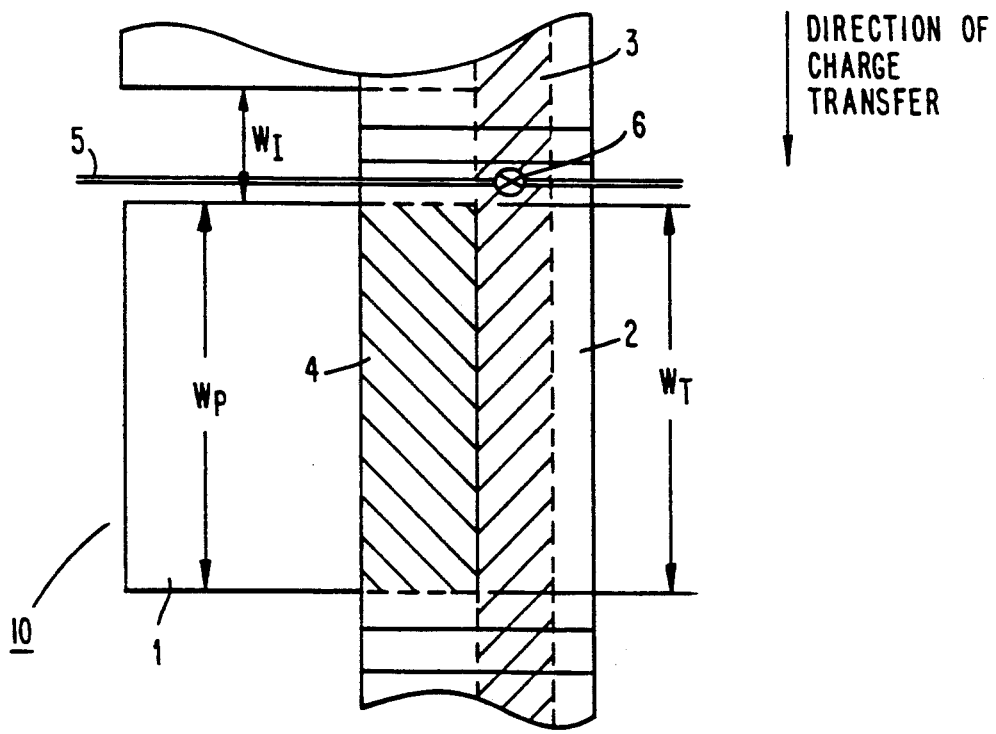
FIG. 5 is a plan view showing a structure of a solid-state image sensor according to one embodiment of the present invention.
Figure 6:
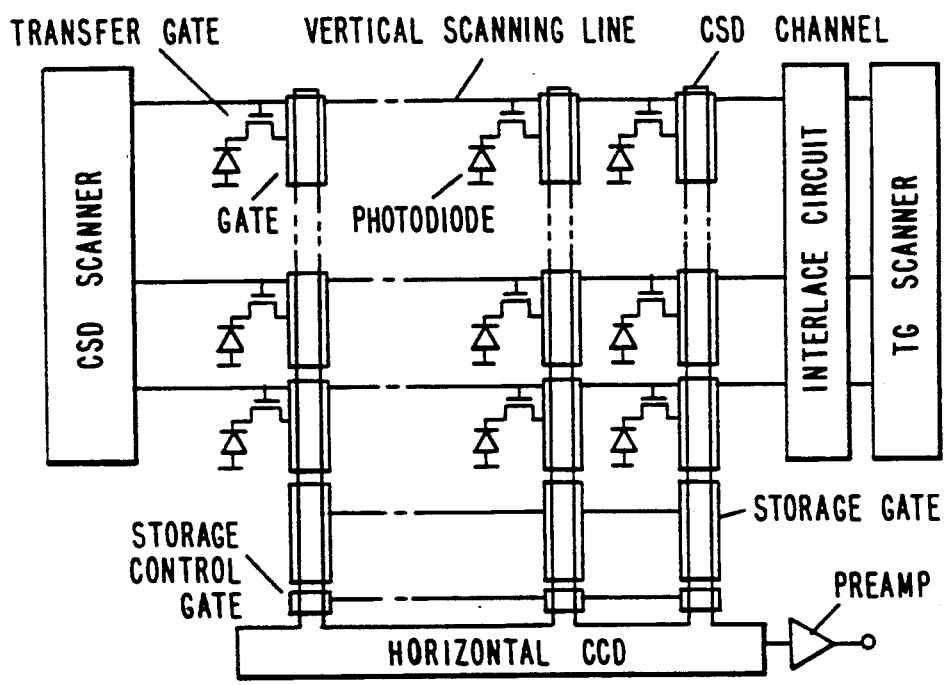
FIG. 6 is a block diagram of a CSD.
Figure 7:
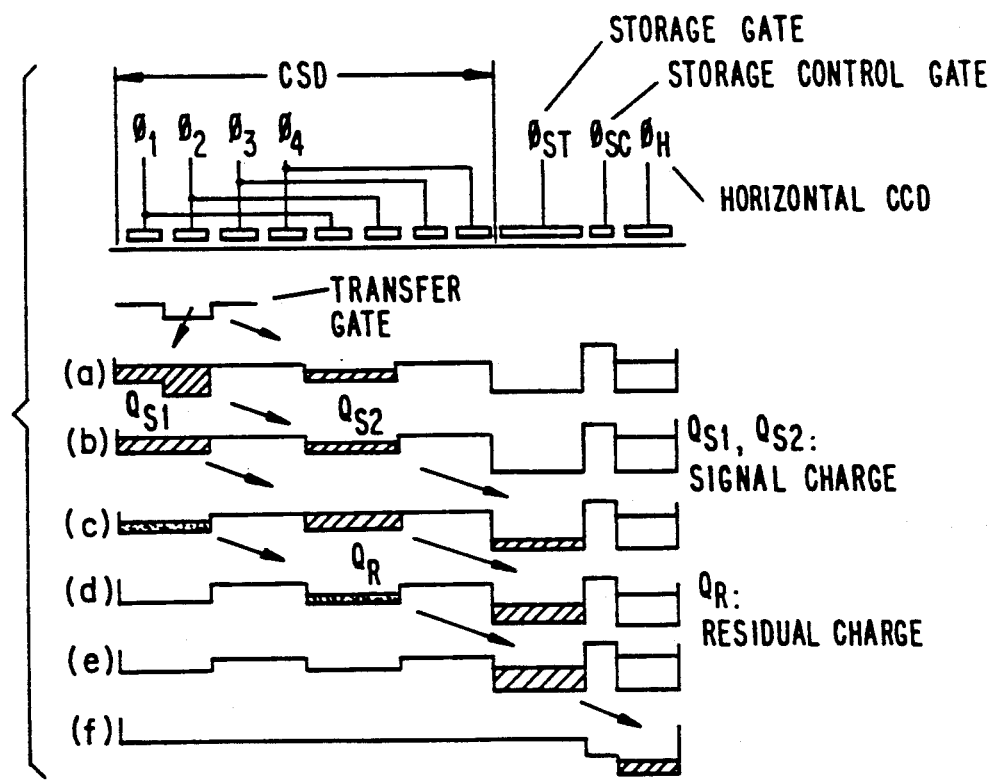
FIG. 7 shows the operation of the CSD.

FIG. 5 is a plan view showing a layout of one pixel of the solid-state image sensor according to one embodiment of the present embodiment, which corresponds to the conventional one in FIG. 1. Corresponding parts are denoted by the same reference numerals. As may be seen from FIG. 5, the width $W_T$ of the transfer gate 4 along the direction of the charge transfer is made equal to the width $W_P$ of a photo-electro transforming element such as a photodiode along the direction of the charge transfer. Generally, the width $W_I$ of the isolation for electrically isolating the adjacent photo-electro transforming elements (e.g., photodiode) 1 is $W_I << W_P$, so that almost all of the channel 3 of the CSD is adjacent to the transfer gate 4.

Figure 3:
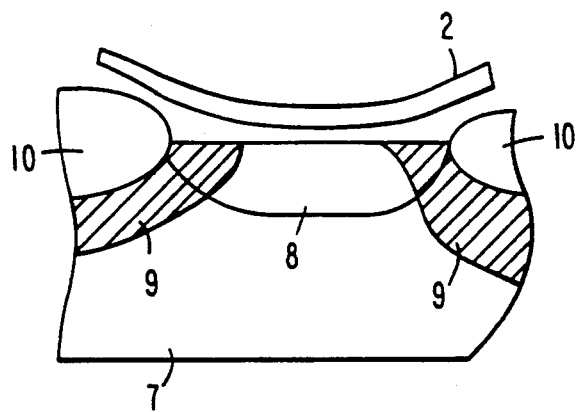
FIG. 3 is a cross-sectional view taken along the line B-B' in FIG. 1.
Figure 4:
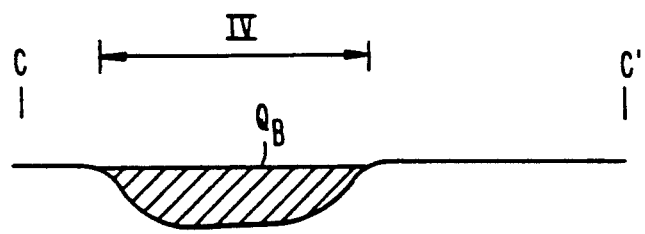
FIG. 4 is a cross sectional view taken along the line C-C' in FIG. 1 showing the potential state formed thereon.

The operation of the present invention will be hereinafter described. The signal charge storage operation and the charge read out operation are completely the same as the conventional operations. However, in the structure of the transfer gate according to the present invention, since $W_P = W_T >> W_I$ as described above, the narrow channel effect shown in FIG. 3 is reduced, and the effect becomes almost uniform along the charge transfer direction in the transfer channel 3. In the isolation part $W_I$, isolation layers are formed on both sides of the transfer channel 3, causing the narrow channel effect. However, the potential well as shown in FIG. 4 is not formed, since the length $W_I$ is quite short and the region corresponds to the contacting part of two gates (gate electrodes between adjacent transfer devices), thereby causing the fringe field effect. Consequently, the perfect transfer of the charge is carried out to enhance the transfer efficiency and to reduce the noise.

Although in the above described embodiment, the oxide film for cell isolation is formed by the selective oxidation process, other method for forming oxide films may be utilized to obtain the same effect as the above described embodiment.

In addition, although in the above described embodiments, the solid-state image sensor using CSD system is described, the present invention may be similarly adaptable to a conventional IL-CCD (interline CCD) system provided that it comprises one pixel formed of one gate.

Although a photodiode is employed as a photo-electro transforming element in the above described embodiment, a solid-state image sensor employing the MIS (metal-insulator-semiconductor) structure or a Schottky barrier diode may be available to obtain the same effect.

Although the width $W_T$ of the transfer gate is equal to the width $W_P$ of the photo-electro transforming element in the above described embodiment, the same effect can be obtained in the case where $W_T > W_P$.

As described above, according to the present invention, a solid-state image sensor capable of preventing the formation of the potential well in the transfer channel having high transfer efficiency and low noise can be obtained, since the width of the transfer gate along the direction of charge transfer is made equal to or wider than the width of the photo-electro transforming element along the direction of the charge transfer.

Although the present invention has been described with reference to a specific embodiment, it should be understood that the above embodiment is an exemplary preferred embodiment and that modifications may be made without departing from the scope of the invention as defined in the appended claims.

What is claimed is:

1. A solid-state image sensor comprising a plurality of pixels, arranged in a matrix formed of rows and columns, extending over an image area each converting a supplied optical signal into a signal charge, and charge transfer means for transferring signal charge from at least one pixel among said plurality of pixels, which are arranged in the same row, in a charge transfer direction, said charge transfer means including a charge transfer channel layer formed of an impurity doped region into a substrate and extending over a row in said charge transfer direction, and wherein said charge transfer means comprises a charge sweep type device in which a packet of electrical charge from a photo-electric transforming element is transferred to a charge transfer channel of said charge transfer means and the potentials of portions of said charge transfer channel are manipulated in a manner to transfer substantially all charge contained within said one of said packets of electrical charge out of said charge transfer channel prior to transferring another of said packets of electrical charge into said charge transfer channels, each of said plurality of pixels comprising:

a photo-electro transforming element on said substrate, forming a potential well of a first predetermined depth and extending in said charge transfer direction on the image area for transforming a given optical signal into a packet of signal charge, opposite ends of said element in said charge transfer direction being spaced apart from each other by a width $W_p$, an end of said element being separated from a proximal end of an adjacent photo-electro transforming element by a distance $W_I$;

a charge transfer gate region in said substrate, connected to said photo-electro transforming element and to said channel layer of said charge transfer means, forming a potential well having a depth less than said predetermined depth, opposite ends of said charge transfer channel layer in said vertical charge transfer direction being spaced apart from each other by a width $W_T$; and a single transfer gate on said charge transfer gate region continuously extending over a portion of said channel layer for controlling the depth of said potential well in said charge transfer gate region to control charge transfer in said charge transfer gate region from each photo-electro transforming element and in said channel layer.

2. A solid-state image sensor according to claim 1, wherein said photo-electro transforming element is a photodiode;

3. A solid-state image sensor according to claim 1, wherein said photo-electro transforming element is a Schottky diode.

4. A solid-state image sensor according to claim 1, wherein said photo-electro transforming element is a metal-insulator-semiconductor device.

5. A solid-state image sensor as recited in claim 1 in which said distance $W_I$ is sufficiently small to reduce the difference in depth of the potential well in said charge transfer channel by a fringe field effect in regions where said charge transfer channel is narrowed by the narrow channel effect at a separation between said photo-electro transforming elements.

6. A solid-state image sensor having a substrate, a plurality of radiation-sensitive elements formed on said substrate and arranged in rows and columns, a plurality of charge transfer means including at least a charge transfer channel formed in said substrate, each said charge transfer channel being arranged between respective ones said columns of radiation-sensitive elements, a plurality of scanning lines, each said scanning line being arranged between respective ones of said rows of radiation sensitive elements and isolation regions formed in said substrate adjacent one side of each of said charge transfer channels and having salient portions extending in a direction away from said charge transfer channel side to which said isolation region is adjacent and a plurality of charge transfer gate structures, each electrically connected to one of said scanning lines and overlying a region including a portion of one of said radiation-sensitive devices and a portion of one of said charge transfer channels to define a charge transfer channel region, wherein each said charge transfer means comprises a charge sweep-type device in which a packet of electrical charge from a photo-electric conversion device is transferred to a charge transfer channel of said charge transfer means and the potentials of portions of said charge transfer channel are manipulated in a manner to transfer substantially all charge contained within said one of said packets of electrical charge out of said transfer channel prior to transferring another of said packets of electrical charge into said charge transfer channel, and wherein said salient portions of said isolation regions having a dimension in a direction parallel to said charge transfer channels which is much less than a dimension in the same direction of an adjacent one of said radiation-sensitive elements, and each said charge transfer channel region having a dimension in a direction parallel to said charge transfer channels which is equal to or greater than the dimension, in the same direction, of the radiation sensitive element which said transfer gate overlies whereby uniformity of potential in said charge transfer channel is enhanced and narrow channel effects in said transfer channel are avoided.

7. A solid-state image sensor as defined in claim 6, wherein said transfer channel region is bounded in a direction parallel to the direction of said transfer channels by said salient portions of said isolation regions.

8. A solid-state image sensor as recited in claim 6 in which said dimension of said salient portion is sufficiently small to reduce the depth of the potential well is said transfer channel by a fringe field effect in regions where said transfer channel is narrowed by the narrow channel effect due to said isolation region.

9. A solid-state image sensor according to claim 6, wherein said radiation-sensitive device is a photodiode.

10. A solid-state image sensor according to claim 6, wherein said radiation-sensitive device is a Schottky diode.

11. A solid-state image sensor according to claim 6, wherein said radiation-sensitive device is a metal-insulator-semiconductor device.

12. A solid-state image sensor comprising a plurality of pixels, arranged in a matrix formed of rows and columns, extending over an image area each converting a supplied optical signal into a signal charge, and charge transfer means for transferring signal charge from at least one pixel among said plurality of pixels, which are arranged in the same row, in a charge transfer direction, said charge transfer means including a charge transfer channel layer formed of an impurity doped region into a substrate and extending over a row in said charge transfer direction, and wherein said charge transfer means comprises a charge sweep type device in which a single packet of electrical charge from a photo-electric transforming element is transferred to a charge transfer channel of said charge transfer means and collected by a sweep out operation before another single packet is transferred to said charge transfer channel, each of said plurality of pixels comprising:

- a photo-electro transforming element on said substrate, forming a potential well of a first predetermined depth and extending in said charge transfer direction on the image area for transforming a given optical signal into a packet of signal charge, opposite ends of said element in said charge transfer direction being spaced apart from each other by a width $W_p$, an end of said element being separated from a proximal end of an adjacent photo-electro transforming element by a distance $W_I$,
- a charge transfer gate region in said substrate, connected to said photo-electro transforming element and to said channel layer of said charge transfer means, forming a potential well having a depth less than said predetermined depth, opposite ends of said charge transfer channel layer in said vertical charge transfer direction being spaced apart from each other by a width $W_T$;
- a single transfer gate on said charge transfer gate region and continuously extending over a portion of said channel layer for controlling the depth of said potential well in said charge transfer gate region to control charge transfer in said charge transfer gate region from each said photo-electro transforming element and in said channel layer;
- wherein, to reduce a narrow channel effect and irregularity of potential in said charge transfer channel layer, said width $W_T$ of said charge transfer channel layer is made greater than or equal to said width $W_P$ of said photo-electro transforming element and both said width $W_P$ and said width $W_T$ are made much greater than said distance $W_I$.

13. A solid-state image sensor according to claim 12, wherein said photo-electro transforming element (1) is a photodiode.

14. A solid-state image sensor according to claim 12, wherein said photo-electro transforming element (1) is a Schottky diode.

15. A solid-state image sensor according to claim 12, wherein said photo-electro transforming element (1) is a metal-insulator-semiconductor device.

16. A solid-state image sensor according to claim 12, wherein said transfer means is a Charge Sweep Device.

17. A solid-state image sensor as recited in claim 12 in which said distance $W_I$ is sufficiently small to reduce the difference in depth of the potential well in said charge transfer channel by a fringe field effect in regions where said transfer channel is narrowed by the narrow channel effect at a separation between said photo-electro transforming elements.

18. A solid-state image sensor having a substrate, a plurality of radiation-sensitive elements formed on said substrate and arranged in rows and columns, a plurality of charge transfer means including at least a charge transfer channel formed in said substrate, each said charge transfer channel being arranged between respective ones said columns of radiation-sensitive elements, a plurality of scanning lines, each said scanning line being arranged between respective ones of said rows of radiation sensitive elements and isolation regions formed in said substrate adjacent one side of each of said charge transfer channels and having salient portions extending in a direction away from said charge transfer channel side to which said isolation region is adjacent and a plurality of charge transfer gate structures, each electrically connected to one of said scanning lines and overlying a region including a portion of one of said radiation-sensitive devices and a portion of one of said charge transfer channels to define a charge transfer channel region, wherein each said charge transfer means comprises a charge sweep type device in which a single packet of electrical charge from a photo-electric transforming element is transferred to a charge transfer channel of said charge transfer means and collected by a sweep out operation before another single packet is transferred to said charge transfer channel, each of said plurality of pixels comprising:

- said salient portions of said isolation regions having a dimension in a direction parallel to said charge transfer channel which is much less than a dimension in the same direction of an adjacent one of said radiation-sensitive elements, and
- each said charge transfer channel region having a dimension in a direction parallel to said charge transfer channels which is equal to or greater than the dimension, in the same direction, of the radiation sensitive element which said transfer gate overlies whereby uniformity of potential in said charge transfer channel is enhanced and narrow channel effects in said transfer channel are avoided.

19. A solid-state image sensor as defined in claim 18, wherein said transfer channel region is bounded in a direction parallel to the direction of said transfer channels by said salient portions of said isolation regions.

20. A solid-state image sensor as recited in claim 18 in which said dimension of said salient portion is sufficiently small to reduce the depth of the potential well in said transfer channel by a fringe field effect in regions where said transfer channel is narrowed by the narrow channel effect due to said isolation region.

21. A solid-state image sensor according to claim 18, wherein said radiation-sensitive device is a photodiode.

22. A solid-state image sensor according to claim 18, wherein said radiation-sensitive device is a Schottky diode.

23. A solid-state image sensor according to claim 18, wherein said radiation-sensitive device is a metal-insulator-semiconductor device.

24. A solid-state image sensor comprising a plurality of pixels, arranged in a matrix formed of rows and columns, extending over an image area each converting a supplied optical signal into a signal charge, and charge transfer means for transferring signal charge from at least one pixel among said plurality of pixels, which are arranged in the same row, in a charge transfer direction, said charge transfer means including a charge transfer channel layer formed of an impurity doped region into a substrate and extending over a row in said charge transfer direction, and wherein said charge transfer means comprises a charge sweep type device, each of said plurality of pixels comprising:

a photo-electro transforming element on said substrate, forming a potential well of a first predetermined depth and extending in said charge transfer direction on the image area for transforming a given optical signal into a packet of signal charge, opposite ends of said element in said charge transfer direction being spaced apart from each other by a width $W_p$, an end of said element being separated from a proximal end of an adjacent photo-electro transforming element by a distance $W_I$, a charge transfer gate region in said substrate, connected to said photo-electro transforming element and to said channel layer of said charge transfer means, forming a potential well having a depth less than said predetermined depth, opposite ends of said charge transfer channel layer in said vertical charge transfer direction being spaced apart from each other by a width $W_T$; and a single transfer gate on said charge transfer gate region continuously extending over a portion of said channel layer for controlling the depth of said potential well in said charge transfer gate region to control charge transfer in said charge transfer gate region from each said photo-electro transforming element and in said channel layer;

said photo-electro transforming element being a Schottky diode;

wherein, to reduce a narrow channel effect and irregularity of potential in said charge transfer channel layer, said width $W_T$ of said charge transfer channel layer is made greater than or equal to said width $W_P$ of said photo-electro transforming element and both said width $W_P$ and said width $W_T$ are made much greater than said distance $W_I$.

25. A solid-state image sensor having a substrate, a plurality of radiation-sensitive elements formed on said substrate and arranged in rows and columns, a plurality of charge transfer means including at least a charge transfer channel formed in said substrate, each said charge transfer channel being arranged between respective ones said columns of radiation-sensitive elements, a plurality of scanning lines, each said scanning line being arranged between respective ones of said rows of radiation sensitive elements and isolation regions formed in said substrate adjacent one side of each of said charge transfer channels and having salient portions extending in a direction away from said charge transfer channel side to which said isolation region is adjacent and a plurality of charge transfer gate structures, each electrically connected to one of said scanning lines and overlying a region including a portion of one of said radiation-sensitive devices and a portion of one of said charge transfer channels to define a charge transfer channel region, wherein each said charge transfer means comprising a charge sweep type device, said salient portions of said isolation regions having a dimension in a direction parallel to said charge transfer channels which is much less than a dimension in the same direction of an adjacent one of said radiation-sensitive elements, each said charge transfer channel region having a dimension in a direction parallel to said charge transfer channels which is equal to or greater than the dimension, in the same direction, of the radiation sensitive element which said transfer gate overlies, and said radiation-sensitive device being a metal-insulator-semiconductor device, whereby uniformity of potential in said charge transfer channel is enhanced and narrow channel effects in said transfer channel are avoided.

26. A solid-state image sensor comprising a plurality of pixels, arranged in a matrix formed of rows and columns, extending over an image area each converting a supplied optical signal into a signal charge, and charge transfer means for transferring signal charge from at least one pixel among said plurality of pixels, which are arranged in the same row, in a charge transfer direction, said charge transfer means including a charge transfer channel layer formed of an impurity doped region into a substrate and extending over a row in said charge transfer direction, and wherein said charge transfer means comprises a charge sweep type device in which a packet of electrical charge from a photo-electric transforming element is transferred to a charge transfer channel of said charge transfer means and collected by a sweep out operation, each of said plurality of pixels comprising:

a photo-electro transforming element on said substrate, forming a potential well of a first predetermined depth and extending in said charge transfer direction on the image area for transforming a given optical signal into a packet of signal charge, opposite ends of said element in said charge transfer direction being spaced apart from each other by a width $W_P$, an end of said element being separated from a proximal end of and adjacent photo-electro transforming element by a distance $W_I$, a charge transfer gate region in said substrate, connected to said photo-electro transforming element and to said channel layer of said charge transfer means, forming a potential well having a depth less than said predetermined depth, opposite ends of said charge transfer channel layer in said vertical charge transfer direction being spaced apart from each other by a width $W_T$;

a single transfer gate on said charge transfer gate region continuously extending over a portion of said channel layer for controlling the depth of said potential well in said charge transfer gate region to control charge transfer in said charge transfer gate region from each said photo-electro transforming element and in said channel layer; and said photo-electro transforming element being a Schottky diode;

wherein, to reduce a narrow channel effect and irregularity of potential in said charge transfer channel layer, said width $W_T$ of said charge transfer channel layer is made greater than or equal to said width $W_P$ of said photo-electro transforming element and both said width $W_P$ and said width $W_T$ are made much greater than said distance $W_I$.

27. A solid-state image sensor having a substrate, a plurality of radiation-sensitive elements formed on said substrate and arranged in rows and columns, a plurality of charge transfer means including at least a charge transfer channel formed in said substrate, each said charge transfer channel being arranged between respective ones said columns of radiation-sensitive elements, a plurality of scanning lines, each said scanning line being arranged between respective ones of said rows of radiation sensitive elements and isolation regions formed in said substrate adjacent one side of each of said charge transfer channels and having salient portions extending in a direction away from said charge transfer channel side to which said isolation region is adjacent and a plurality of charge transfer gate structures, each electrically connected to one of said scanning lines and overlying a region including a portion of one of said radiation-sensitive devices and a portion of one of said charge transfer channels to define a charge transfer channel region, wherein said charge transfer means comprises a charge sweep type device in which a packet of electrical charge from a photo-electric transforming element is transferred to a charge transfer channel of said charge transfer means and collected by a sweep out operation, said salient portions of said isolation regions having a dimension in a direction parallel to said charge transfer channels which is much less than a dimension in the same direction of an adjacent one of said radiation-sensitive elements, each said charge transfer channel region having a dimension in a direction parallel to said charge transfer channels which is equal to or greater than the dimension, in the same direction, of the radiation sensitive element which said transfer gate overlies, and said radiation-sensitive device being a metal-insulator-semiconductor device, whereby uniformity of potential in said charge transfer channel is enhanced and narrow channel effects in said transfer channel are avoided.

* * * * *